United States Patent
Schenker et al.

(10) Patent No.: US 7,084,960 B2
(45) Date of Patent: Aug. 1, 2006

(54) LITHOGRAPHY USING CONTROLLED POLARIZATION

(75) Inventors: Richard Schenker, Portland, OR (US); Kevin Huggins, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 126 days.

(21) Appl. No.: 10/813,453

(22) Filed: Mar. 29, 2004

(65) Prior Publication Data

US 2005/0213072 A1    Sep. 29, 2005

(51) Int. Cl.
 G03B 27/72 (2006.01)
 G03B 27/54 (2006.01)
 G03B 27/42 (2006.01)

(52) U.S. Cl. .............. 355/71; 355/67; 355/53
(58) Field of Classification Search ............ 355/71, 355/53, 67
See application file for complete search history.

(56) References Cited

U.S. PATENT DOCUMENTS

| | | | |
|---|---|---|---|
| 4,302,079 A | 11/1981 | White | |
| 5,673,103 A * | 9/1997 | Inoue et al. | 355/71 |
| 6,324,003 B1 | 11/2001 | Martin | |
| 6,404,482 B1 * | 6/2002 | Shiraishi | 355/53 |
| 2005/0225829 A1 | 10/2005 | Schenker | |

OTHER PUBLICATIONS

Richard Schenker et al., "Material Limitations to 193-nm Lithographic System Lifetimes", SPIE vol. 2726, pp. 698-706.
Richard E. Schenker et al., "Ultraviolet-induced densification in fused silica", J. Appl. Phys. 82 (3), Aug. 1, 1997, pp. 1065-1071.
G. de Zwart et al., "Performance of a Step and Scan System for DUV Lithography", SPIE vol. 3051, pp. 817-830.
Adam et al., "Polarization Effects in Immersion Lithography," Proc. of SPIE, vol. 5377, pp. 329-342 (2004).

* cited by examiner

Primary Examiner—Peter B. Kim
(74) Attorney, Agent, or Firm—Fish & Richardson P.C.

(57) ABSTRACT

Lithography using controlled polarization. One aspect generates an electromagnetic radiation suitable for production of microelectronic devices, linearly polarizes at least a portion of the radiation at a pupil plane of a projection system to form linearly polarized radiation, and exposing a substrate using the linearly polarized radiation at a high exposure angle.

29 Claims, 6 Drawing Sheets

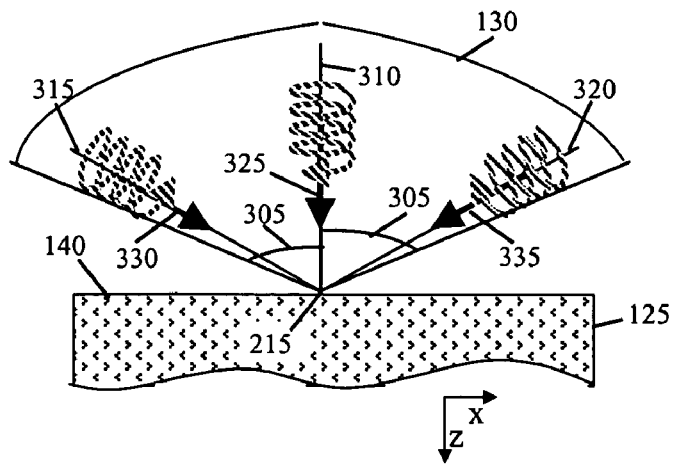
PRIOR ART      FIG. 3
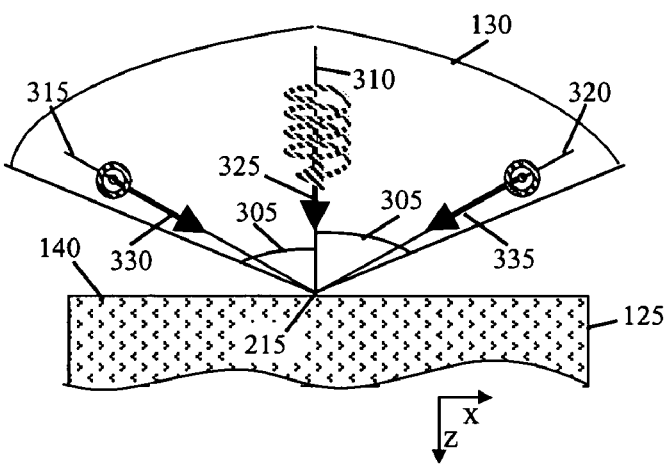
FIG. 4
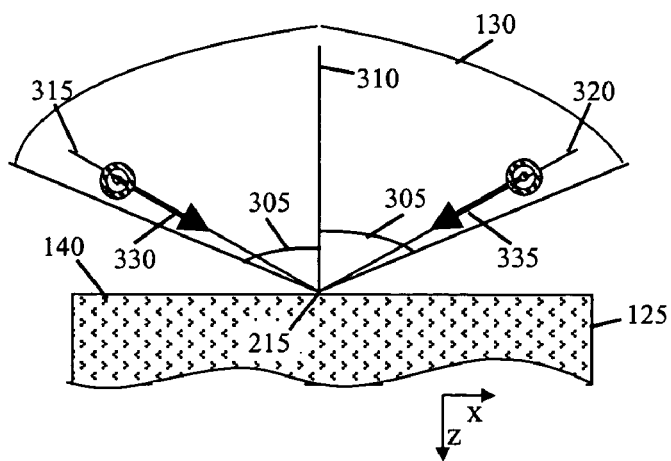
FIG. 5

LITHOGRAPHY USING CONTROLLED POLARIZATION

BACKGROUND

This disclosure relates to lithography systems and techniques that use controlled polarization.

Lithography is a printing process in which a pattern is rendered on a substrate. The pattern can be rendered using lithography masks and other optical elements that transfer the pattern to the substrate. The resultant pattern can be used, e.g., to form integrated circuits on semiconductor wafers.

DESCRIPTION OF DRAWINGS

FIG. 3 illustrates a prior art technique for exposing a substrate.

FIGS. 4 and 5 illustrate implementations of systems and techniques for exposing a substrate.

Like reference symbols in the various drawings indicate like elements.

DETAILED DESCRIPTION

Figure 1:
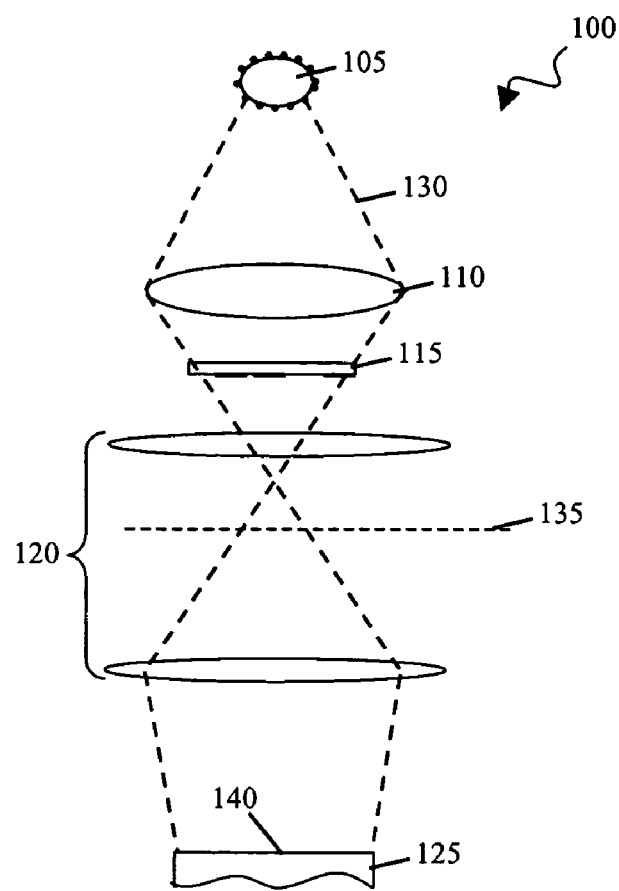
FIG. 1 shows a block diagram of a lithography system.

FIG. 1 shows a photolithography system 100. System 100 can be, for example, an air photolithography system or an immersion photolithography system. System 100 includes an illumination source 105, an illumination system 110, a mask 115, a projection system 120, and a substrate 125.

Illumination source 105 is a device capable of generating and emitting electromagnetic radiation 130. Radiation 130 can be coherent in that the emitted optical waves maintain a fixed and predictable phase relationship with each other for a period of time. Radiation 130 can be selected for use in lithographic patterning of microelectronic devices. For example, radiation 130 can be sub-visible wavelength radiation such as 193-nm radiation.

Illumination system 110 can include an aperture, a condenser, a filter, as well as additional devices for collecting, collimating, filtering, and focusing radiation 130 emitted from source 105.

Mask 115 is positioned in system 100 by a mask stage to influence the incidence of radiation 130 upon substrate 125. Mask 115 can include different regions that transmit electromagnetic radiation with different transmissivities and phases. For example, mask 115 can be a strong or a weak phase shift mask, such as an alternating phase shift mask or an embedded phase shift mask.

Projection system 120 can include an aperture, an objective, as well as additional devices, for collecting, filtering, and focusing the portion of radiation 130 that passes through mask 115. Projection system 120 generally includes one or more pupil planes 135. The spatial intensity distribution at pupil plane(s) 135 generally corresponds to an angular distribution of the radiation at substrate 125.

Substrate 125 is a workpiece to be patterned by system 100. Substrate 125 includes a working surface 140. Substrate 125 can be presented to system 100 by a vacuum chuck or other support (not shown) so that radiation 130 is focused on working surface 140 to form a pattern. Substrate 125 can include a resist material above a base material. Substrate 125 can be patterned to form all or a portion of a microelectronic device. The resist material can be a material that is sensitive to radiation 130. For example, the resist material can be a positive or negative photoresist.

Figure 2:
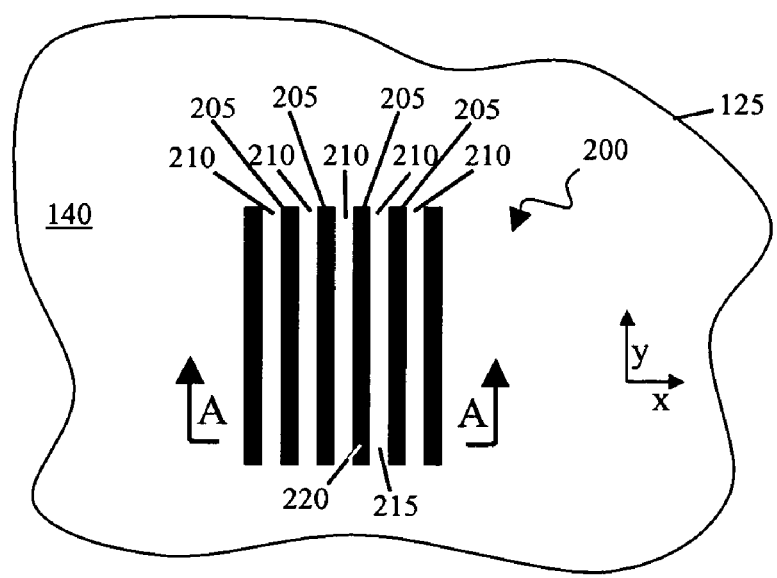
FIG. 2 shows an example pattern that can be focused on a working surface.

FIG. 2 shows an example pattern 200 that can be imaged by system 100 onto working surface 140. Pattern 200 includes an alternating series of lines 205 and spaces 210. Lines 205 and spaces 210 are oriented with a main axis in the y-direction and a smallest pitch in the x-direction. Pitch is the spatial periodicity of features. For example, the pitch of lines 205 in the x-direction is the sum of the width of lines 205 and the width of spaces 210.

Lines 205 and spaces 210 can be formed using any of a number of different masks including, e.g., alternating phase shift masks and embedded phase shift masks. A point 215 is located in the midst of one of spaces 210 and a point 220 is located in the midst of one of lines 205.

FIG. 3, taken along section A—A (FIG. 2), illustrates a prior art technique for imaging pattern 200 onto working surface 140. Although the entirety of pattern 200 can be exposed at one time using this technique, for the sake of simplicity, FIG. 3 only schematically illustrates a portion of the incident radiation exposing point 215 on substrate 125. Point 215 is exposed by a cone of radiation 130 that can subtend a maximum exposure angle 305. Maximum exposure angle 305 is generally determined at least in part by the numerical aperture of the system 100. The conical expanse spanned by exposure angle 305 includes rays 310, 315, 320. Ray 310 is incident upon point 215 of substrate 125 at an angle that is substantially normal to working surface 140. Rays 315, 320 are incident upon point 215 of substrate 125 at high exposure angles in the vicinity of the maximum exposure angle 305. For example, rays 315, 320 can be incident upon point 215 at exposure angles of 45 degrees and above. In an alternate but less preferred implementation, rays 315, 320 can be incident upon point 215 at exposure angles of 55 degrees and above.

Radiation 130 includes optical waves 325, 330, 335. Optical wave 325 travels along ray 310. Optical wave 330 travels along ray 315. Optical wave 335 travels along ray 320. Optical waves 325, 330, 335 are circularly polarized in that the direction of the electric fields of waves 325, 330, 335 circumscribe helices as waves 325, 330, 335 propagate.

Given that the electric fields of waves 325, 330, 335 circumscribe helices, the electric fields of waves 325, 330, 335 are generally not oriented in the same direction when waves 325, 330, 335 are incident upon point 215. Similar discrepancies in orientation of the electric fields also occur with other optical waves that are incident on other points on working surface 140 (not shown). The net effect of these discrepancies in orientation is a limitation of interference effects and reduced contrast on working surface 140. These reductions in contrast increase as the exposure angles increase.

FIG. 4, also taken along section A—A (FIG. 2), illustrates an implementation of a system and a technique for exposing point 215 on substrate 125. Point 215 is exposed by optical waves 325, 330, 335 each traveling along the respective of rays 310, 315, 320. Optical wave 325 is circularly polarized, whereas optical waves 330, 335 are linearly polarized with the electric fields of waves 330, 335 being directed into and out of the plane of the page (i.e., in the y-direction) as waves 330, 335 propagate. Waves 330, 335 are thus linearly polarized perpendicular to their propagation direction and parallel to the image plane on substrate 125. Up to all of the optical waves in the vicinity of the outer bounds of maximum exposure angle 305 can be linearly polarized in this manner, as discussed further below.

Since the electric fields of waves 330, 335 are oriented in the same direction when waves 330, 335 are incident upon point 215, constructive interference between waves 330, 335 at point 215 increases the intensity of the exposure of point 215. Similarly, destructive interference of waves 330, 335 at point 220 decreases the intensity of the exposure of point 220. These interference effects increase the contrast of the pattern 200 imaged onto working surface 140.

FIG. 5, also taken along section A—A (FIG. 2), illustrates another implementation of a system and a technique for exposing point 215 on substrate 125. Optical waves 330, 335 remain linearly polarized and are incident upon point 215 on substrate 125. However, the radiation that travels along rays in the vicinity of ray 310 has been attenuated or eliminated. Selected portions of radiation 130 (such as optical wave 325) can thus be prevented from exposing point 215.

For the sake of clarity of illustration, FIGS. 4 and 5 show optical waves 330, 335 perfectly linearly polarized. However, optical waves 330, 335 need not be perfectly linearly polarized. Rather, optical waves 330, 335 can be somewhat elliptically polarized with the proportion of radiation polarized in the illustrated direction being significant enough to achieve the described interference effects and increased contrast.

FIGS. 6–9 illustrate implementations of how radiation 130 can be polarized in a pupil plane (e.g., pupil plane 135) in system 100 to improve the quality of printing. The illustrated polarizations can be obtained using a number of different techniques, including transmission polarizing, reflection polarizing, scattering techniques, double refraction techniques, and birefringence techniques.

Figure 6:
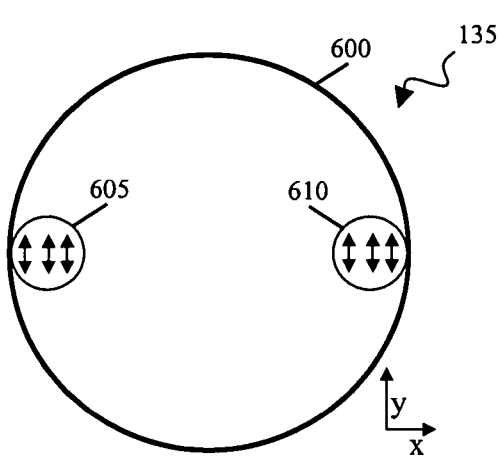
FIGS. 6–9 illustrate implementations of how radiation can be polarized to improve the quality of printing.

FIG. 6 shows an area 600 in pupil plane 135 that encompasses the angular distribution of the radiation that is to expose the pattern to be formed on substrate 125. Area 600 can be entirely exposed by radiation 130 or area 600 can include dark portions where the intensity of radiation 130 is zero.

Area 600 includes linearly polarized regions 605, 610. Regions 605, 610 are located at high angles in the x-direction and can encompass optical waves in the vicinity of the outer bounds of exposure angle 305 (FIGS. 4 and 5). Regions 605, 610 include radiation that is linearly polarized in the y-direction.

Figure 7:
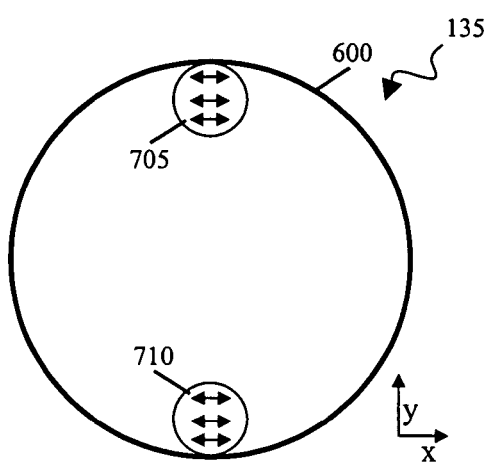

FIG. 7 shows another implementation of area 600 that includes linearly polarized regions 705, 710. Regions 705, 710 are located at high angles in the y-direction. Regions 705, 710 include radiation that is linearly polarized in the x-direction. Regions 705, 710 provide improved contrast of patterns having features with a small pitch in the y-direction in much the same way that regions 605, 610 provide improved contrast of patterns having features with a small pitch in the x-direction (such as pattern 200 (FIG. 2)).

Figure 8:
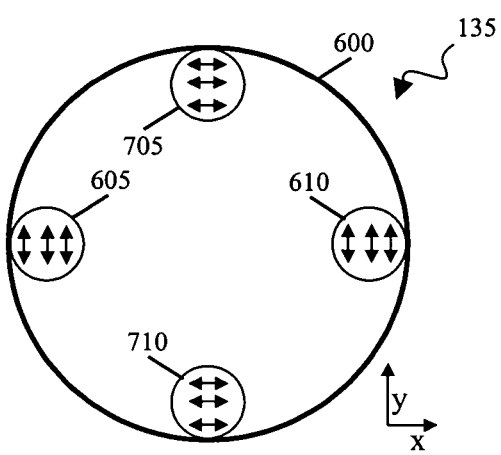

FIG. 8 shows another implementation of area 600 that includes linearly polarized regions 605, 610, 705, 710. With the inclusion of regions 605, 610, 705, 710, improved contrast of patterns having small pitches in both the y-direction and x-direction can be obtained.

Figure 9:
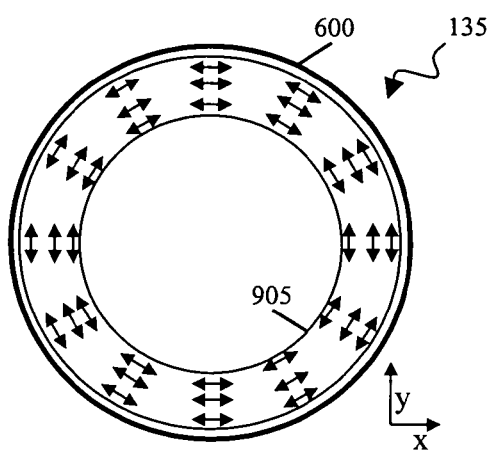

FIG. 9 shows another implementation of area 600 that includes an annular region 905. Radiation at each point in annular region 905 is linearly polarized perpendicular to the propagation direction of the radiation and parallel to the substrate. With such a polarization, improved contrast of patterns having small pitches in any direction can be obtained.

Figure 10:
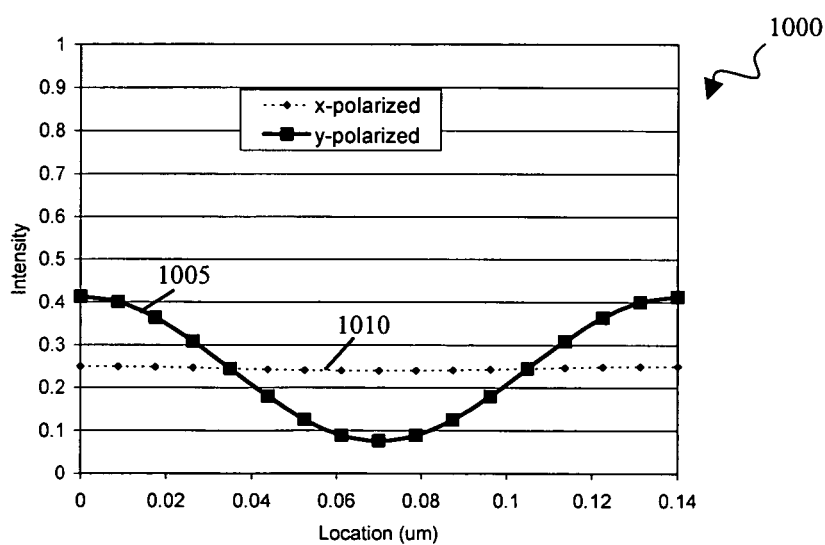
FIGS. 10–13 are graphs that show impacts of the use of linearly polarized radiation in printing.

FIG. 10 is a graph 1000 that shows an impact of the use of linearly polarized radiation in the printing of y-line features (such as lines 205 in pattern 200). Graph 1000 shows the best focus intensity in air as a function of position along a line in the image plane perpendicular to the y-line features. The best focus intensity is normalized with respect to the clear field intensity. The positions in graph 1000 are given in micrometers. The results shown in graph 1000 were calculated using the Yeung vector method for a system that was assumed to include an embedded phase shift mask having y-line features with a 140 nm pitch (60 nm wide EPSM, 80 nm wide glass) in the x-direction. The radiation was assumed to have a wavelength of 193 nm and the photolithography system was assumed to have a numerical aperture of 0.92 and to provide cross quadrupole illumination with quadrupole centers at 0.75 and radii of 0.2 (e.g., one implementation of FIG. 8).

Graph 1000 includes a first trace 1005 and a second trace 1010. Trace 1005 corresponds to the best focus intensity as a function of position when printing y-line features using radiation of a given intensity polarized in the y-direction. Such radiation can be obtained with an area 600 that includes polarized regions 605, 610 (FIG. 6).

Trace 1010 corresponds to the best focus intensity as a function of position when printing y-line features using radiation of the same intensity polarized in the x-direction. Such radiation can be obtained with an area 600 that includes polarized regions disposed like regions 605, 610 but including radiation polarized in the x-direction instead of the y-direction.

The range of intensities spanned by trace 1005 is greater than the range of intensities spanned by trace 1010. Thus, for the given intensity of radiation, the contrast between the y-line features and background is greater when imaged using radiation polarized in the y-direction than when imaged using radiation polarized in the x-direction.

Figure 11:
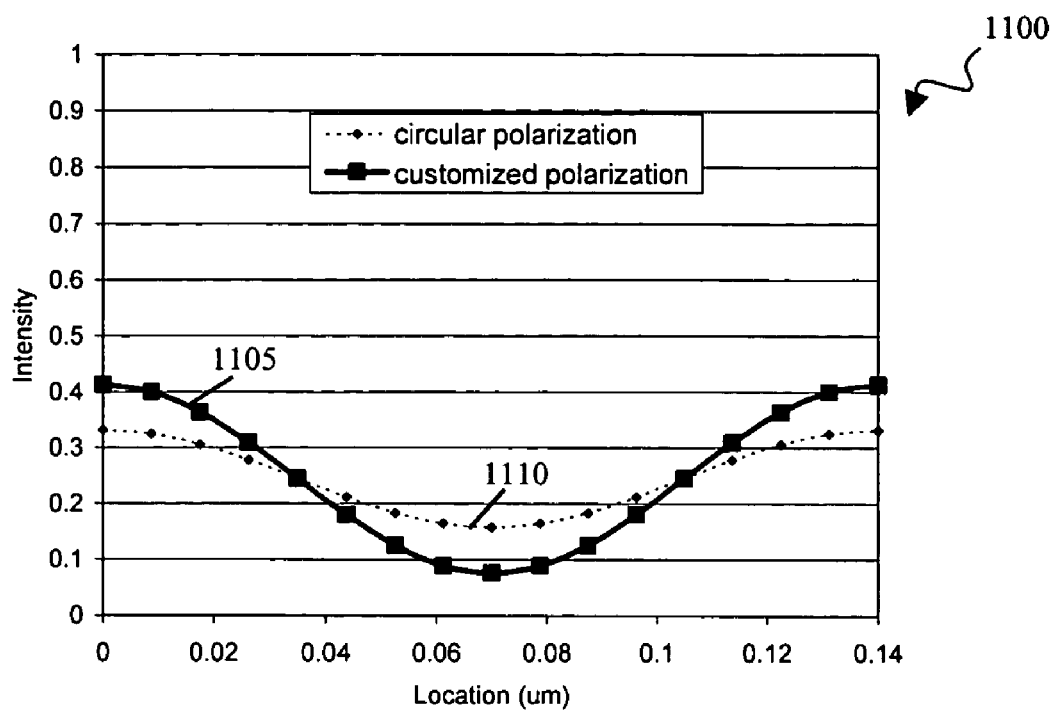

FIG. 11 is a graph 1100 that shows an impact of the use of linearly polarized radiation in the printing of y-line features. Graph 1100 shows the best focus intensity in air as a function of position along a line perpendicular to the y-line features in the image plane for a system under the same assumptions as FIG. 10. Graph 1100 was again calculated using the Yeung vector method and gives the positions in micrometers.

Graph 1100 includes a first trace 1105 and a second trace 1110. Trace 1105 corresponds to the best focus intensity as a function of position when printing y-line features using radiation of a given intensity polarized in both the y-direction and the x-direction. The polarization is set such that it is always nearly parallel to the substrate (x-polarized for large y exposure angles and y-polarized for large x exposure angles). Such radiation can be obtained with an area 600 that includes each of polarized regions 605, 610, 705, 710 (FIG. 8) or by polarized region 905 (FIG. 9).

Trace 1110 corresponds to the best focus intensity as a function of position when printing y-line features using circularly polarized radiation of the same intensity.

The range of intensities spanned by trace 1105 is greater than the range of intensities spanned by trace 1110. Thus, for the given intensity of radiation, the contrast between the y-line features and background is greater when imaged using radiation polarized in both the x-direction and the y-direction than when imaged using circularly polarized radiation.

Figure 12:
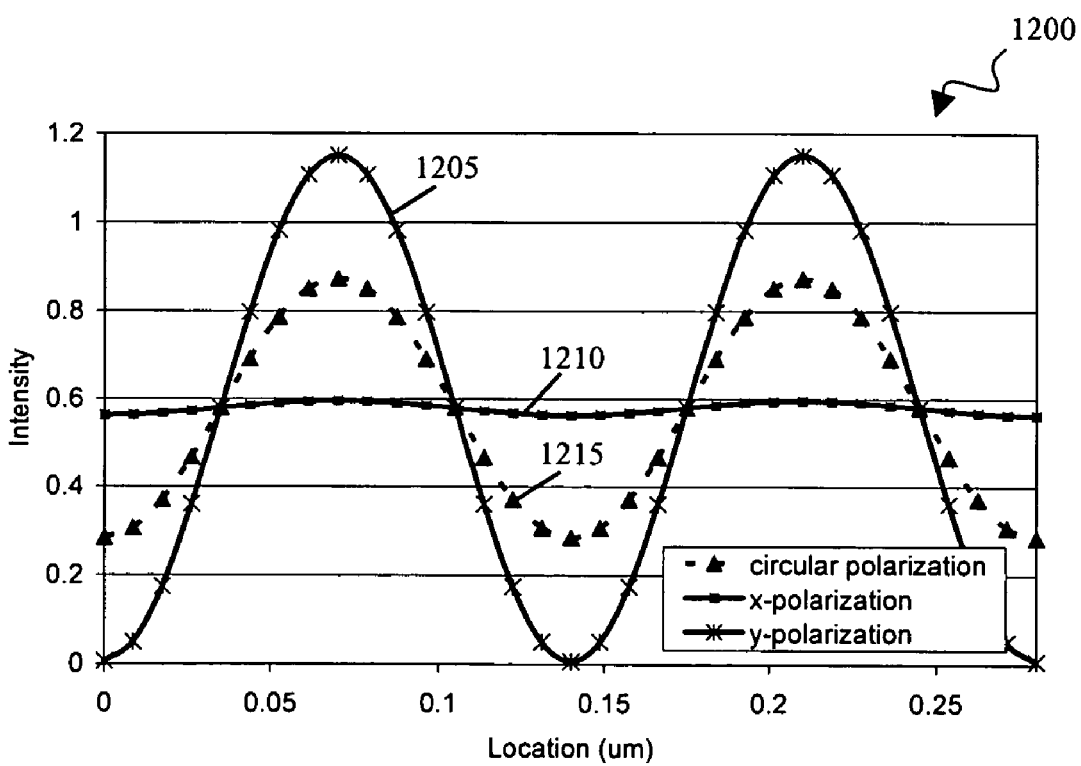

FIG. 12 is a graph 1200 that shows an impact of the use of linearly polarized radiation in the printing of y-line features (such as lines 205 in pattern 200). Graph 1200 shows the intensity in air as a function of position along a line perpendicular to the y-line features in the image plane. The intensity is normalized with respect to the clear field intensity. The positions are given in graph 1200 in micrometers. The results shown in graph 1200 were calculated using the Yeung vector method for a system that was assumed to include an alternating phase shift mask having y-line features with 70 nm wide chrome and a 140 nm pitch in the x-direction. The illumination radiation was assumed to have a wavelength of 193 nm and the photolithography system was assumed to have a numerical aperture of 0.92 and conventional illumination with a partial coherence of sigma 0.2.

Graph 1200 includes a first trace 1205, a second trace 1210, and a third trace 1215. Trace 1205 corresponds to the intensity as a function of position when printing y-line features using radiation of a given intensity polarized in the y-direction. Such radiation can be obtained with an area 600 that includes polarized regions 605, 610 (FIG. 6).

Trace 1210 corresponds to the intensity as a function of position when printing y-line features using radiation of the same intensity polarized in the x-direction. Such radiation can be obtained with an area 600 that includes polarized regions disposed like regions 605, 610 but including radiation polarized in the x-direction instead of the y-direction.

Trace 1215 corresponds to the intensity as a function of position when printing y-line features using circularly polarized radiation of the same intensity.

The range of intensities spanned by trace 1205 is greater than the range of intensities spanned by traces 1210, 1215. Thus, for the given intensity of radiation, the contrast between the y-line features and background is greater when imaged using radiation polarized in the y-direction than either when imaged using radiation polarized in the x-direction or when imaged using circularly polarized radiation.

Figure 13:
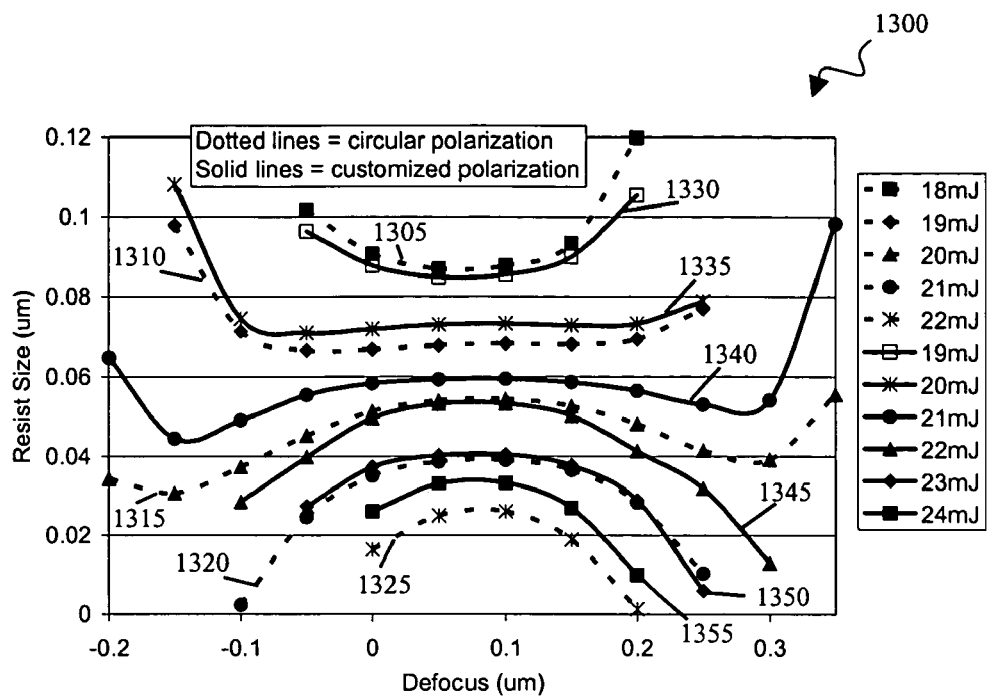

FIG. 13 is a graph 1300 that shows an impact of the use of linearly polarized radiation in the printing of y-line features (such as lines 205 in pattern 200). Graph 1300 shows the resist size of the y-line features as a function of defocus for a number of different radiation intensities. Resist size is the printed size of a feature and is given in graph 1300 in micrometers. Defocus is the distance between the focal plane and the working surface of a substrate and is given in graph 1300 in micrometers. The results shown in graph 1300 were calculated using the Yeung vector method for a system that was assumed to include an alternating phase shift mask having y-line features with 70 nm chrome and a 140 nm pitch in the x-direction. The illumination radiation was assumed to have a wavelength of 193 nm and the photolithography system was assumed to have a numerical aperture of 0.92 and conventional illumination with a partial coherence of sigma 0.2.

Graph 1300 includes traces 1305, 1310, 1315, 1320, 1325, 1330, 1335, 1340, 1345, 1350, 1355. Traces 1305, 1310, 1315, 1320, 1325 correspond to the resist size of y-line features as a function of defocus for circularly polarized radiation having intensities of 18 mJ, 19 mJ, 20 mJ, 21 mJ, and 22 mJ, respectively.

Traces 1330, 1335, 1340, 1345, 1350, 1355 correspond to the resist size of y-line features as a function of defocus for radiation polarized in the y-direction and having intensities of 19 mJ, 20 mJ, 21 mJ, 22 mJ, 23 mJ, and 24 mJ respectively. Such radiation can be obtained with an area 600 that includes polarized regions 605, 610 (FIG. 6).

As shown in graph 1300, the sensitivity of resist size to dose variation is decreased when imaging using radiation polarized in the y-direction as compared to imaging using circularly polarized radiation. The decreased sensitivity to dose variation improves the uniformity of patterning and reduces the probability of defects.

Figure 14:
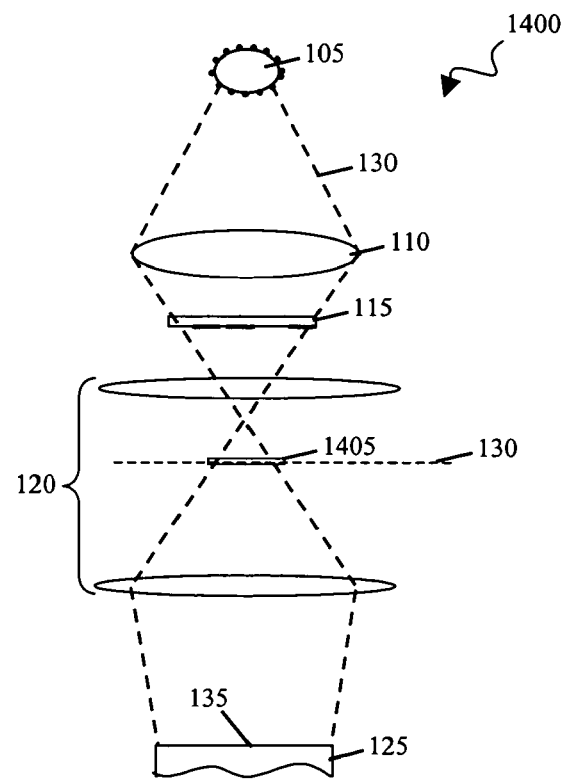
FIG. 14 shows a block diagram of a lithography system.

FIG. 14 shows an implementation of photolithography system 1400. System 1400 includes illumination source 105, illumination system 110, mask 115, projection system 120, and substrate 125, as well as a pupil plane polarizer 1405. Pupil plane polarizer 1405 is positioned at pupil plane 135 in system 1400.

Pupil plane polarizer 1405 is a device or material for suppressing or minimizing particular optical waves in radiation 130. Pupil plane polarizer 1405 can be effective to polarize optical waves so that an increased proportion of the radiation in the vicinity of the outer bounds of an exposure angle is linearly polarized perpendicular to the direction angle and parallel to the image plane. In one implementation, pupil plane polarizer 1405 is effective to perfectly linearly polarize all of the radiation in the vicinity of the outer bounds of the exposure angle.

Pupil plane polarizer 1405 can be used to achieve one or more of the described radiation polarizations in area 600 (FIGS. 6–9). Pupil plane polarizer 1405 can be a transmission polarizer in that radiation 130 passes through pupil plane polarizer 1405.

Figure 15:
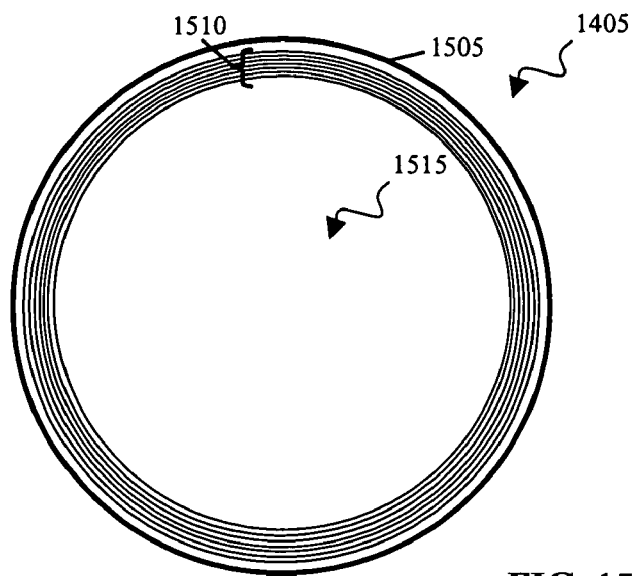
FIG. 15 shows an implementation of a pupil plane polarizer.

FIG. 15 shows an implementation of pupil plane polarizer 1405 from below. Pupil plane polarizer 1405 includes a polarizer substrate 1505 and a collection of polarizing features 1510. Polarizer substrate 1505 can be a made from a material that is at least partially transparent to radiation 130. For example, when radiation 130 is EUV radiation, polarizer substrate 1505 can be a $Si_3N_4$ film peripherally supported by an annular ring. Polarizing features 1415 can be features effective to polarize transmitted radiation 130 as described above. Polarizing features 1415 can be formed using any of a number of high resolution printing techniques, such as electron beam printing, imprint techniques, ion-beam printing, and EUV and x-ray lithography. Pupil plane polarizer 1405, can include a center region 1515 that subtends low exposure angles. Center region 1515 can either be opaque or at least partially transparent to radiation 130.

Figure 16:
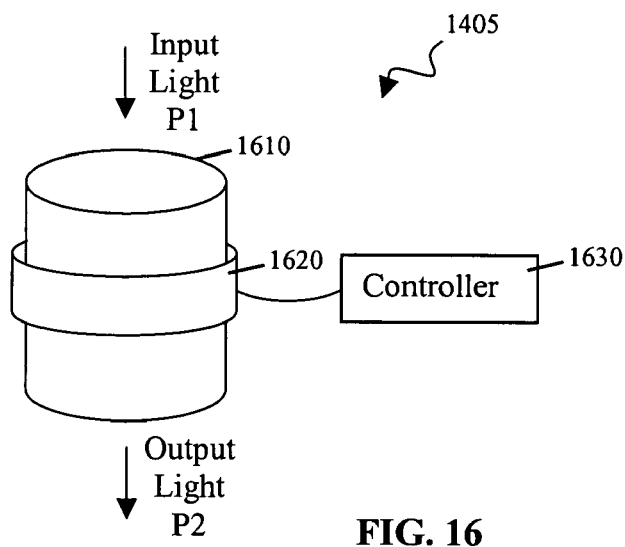
FIGS. 16–17 show another implementation of a pupil plane polarizer.

FIG. 16 shows another implementation of pupil plane polarizer 1405. Pupil plane polarizer 1405 includes a polarization modulator 1610 and a stress modulator 1620. Stress modulator 1620 is in communication with polarization modulator 1610, and may be used to apply a stress to polarization modulator 1610. An optional controller 1630 may be used to control the amount and/or direction of stress applied to polarization modulator 1610 by stress modulator 1620. For example, in some implementations controller 1630 may be used to turn the applied stress on and off, or to vary the spatial and/or temporal distribution of stress applied to polarization modulator 1610.

Stress modulator 1620 may be implemented in a number of ways. For example, stress modulator 1620 may be implemented using a clamping mechanism, so that an inner diameter of stress modulator 1620 may be mechanically decreased to apply stress to polarization modulator 1610. In another example, stress modulator 1620 may be implemented using material with a thermal expansion coefficient sufficiently large to apply a desired stress amount in response to a change in temperature. In another example, stress modulator 1620 may restrict the outer diameter of polarization modulator 1610, and polarization modulator 1610 may be heated or cooled. In this example, the thermal expansion or contraction of the polarization modulator 1610 is used to produce the stress. Many other implementations are possible.

Figure 17:
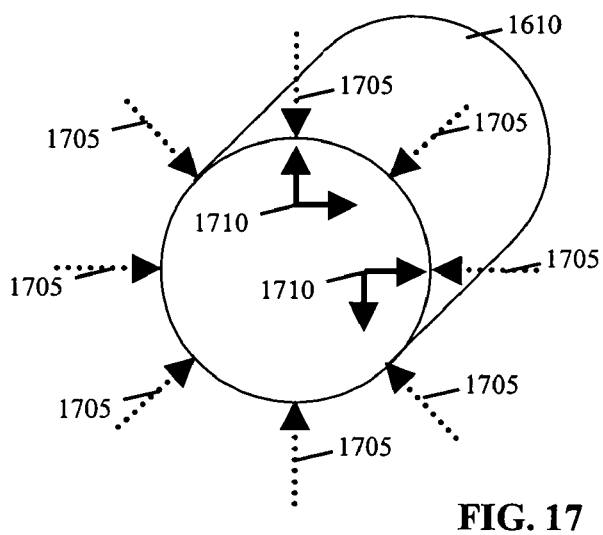

In an implementation, polarization modulator 1610 is a glass cylinder or disc. As illustrated in FIG. 17, external stress 1705 applied to glass creates internal stress 1710 within the glass. Stresses 1705, 1710 make the glass optically birefringent, with a refractive index asymmetry that is a function of the angle around the cylinder. The resulting stress-induced birefringence causes light that passes through the element to change polarization. Light output from modulator 1610 thus has a polarization state P2 different than polarization state P1 of the input light.

In this implementation of pupil plane polarizer 1405, the principle stress directions and associated optical axis vary as a function of angle within modulator 1610. For an implementation in which modulator 1610 is a glass cylinder, the top and bottoms of the glass cylinder rotate the polarization of incoming light in an equal but opposite direction than do the left and right sides of the cylinder. By providing a modulator 1610 having an appropriate geometry and stress profile, the polarization may be customized.

A number of implementations have been described. Nevertheless, it will be understood that various modifications may be made. For example, reflection polarizing or birefringence techniques can be used to polarize radiation in the manners described. The described systems and techniques can be used in immersion and air photolithography. Pupil plane polarizer 1405 can include a dark field at its middle. Areas 600 can be rotated to any extent about their center and the polarized regions can subtend different and varying extents of areas 600. Accordingly, other implementations are within the scope of the following claims.

What is claimed is:

1. A method comprising:
generating an electromagnetic radiation;
linearly polarizing at least a portion of the radiation in a vicinity of a pupil plane of a projection system to form linearly polarized radiation; and
exposing a substrate using the linearly polarized radiation at a high exposure angle,
wherein the portion of the radiation is linearly polarized in a direction that is dependent upon a direction of the exposure angle of the radiation.

2. The method of claim 1, wherein said linearly polarizing the radiation comprises increasing a proportion of radiation polarized in a direction substantially perpendicular to a propagation direction and substantially parallel to a surface of the substrate.

3. The method of claim 2, wherein increasing the proportion of radiation polarized in the direction comprises completely linearly polarizing the radiation in the direction.

4. The method of claim 1, wherein said linearly polarizing the radiation comprises transmission polarizing the radiation at the pupil plane.

5. The method of claim 1, wherein said linearly polarizing the radiation comprises birefringence polarizing the radiation at the pupil plane.

6. The method of claim 1, wherein said linearly polarizing the radiation comprises linearly polarizing an annular ring of radiation at the pupil plane so that the polarization direction at each direction of the exposure angle in the ring is substantially parallel to a tangent to the ring at that direction of the exposure angle.

7. The method of claim 1, wherein said linearly polarizing the radiation comprises linearly polarizing radiation in an opposing pair of regions at high exposure angle in the pupil plane.

8. The method of claim 1, wherein said high exposure angle is an angle greater than 45°.

9. The method of claim 1, wherein exposing the substrate comprises exposing the substrate at a low exposure angle using circularly polarized radiation.

10. The method of claim 1, wherein exposing the substrate comprises exposing the substrate using an immersion lithography system.

11. A method comprising:
generating an electromagnetic radiation;
shifting a phase of some of the radiation using an alternating phase shift mask to define a pattern, the pattern including
first features oriented with a main axis in a first direction and
second features oriented with a main axis in a second direction, the second direction being substantially perpendicular to the first direction;
linearly polarizing at least a portion of the radiation to form linearly polarized radiation; and
exposing a substrate using the linearly polarized radiation at a high exposure angle.

12. The method of claim 11, wherein said linearly polarizing the portion comprises linearly polarizing the portion substantially perpendicular to a propagation direction and substantially parallel to a surface of the substrate.

13. The method of claim 11, wherein said linearly polarizing the portion comprises linearly polarizing the portion in a vicinity of a pupil plane of a projection system.

14. The method of claim 11, further comprising exposing the substrate at a low exposure angle using a second portion of the generated electromagnetic radiation, the second portion not being linearly polarized.

15. The method of claim 14, wherein said exposing the substrate using the second portion comprises exposing the substrate using circularly polarized radiation.

16. The method of claim 11, wherein said exposing the substrate comprises exposing the substrate using radiation forming an annular ring in the pupil plane,
wherein, at each direction of the exposure angle in the annular ring, the radiation is polarized in a direction that is substantially parallel to a tangent to the ring at that direction of the exposure angle.

17. The method of claim 11, wherein said exposing the substrate using the first portion comprises polarizing the electromagnetic radiation using a reflection polarizer.

18. The method of claim 11, wherein said high exposure angle comprise an exposure angle greater than 45°.

19. A lithography system comprising:
a stage to immobilize a substrate;
an electromagnetic radiation source to emit a radiation; and
a projection system having a polarizer in a vicinity of a pupil plane to increase a proportion of radiation linearly polarized in a direction that is substantially perpendicular to a propagation direction of the radiation, parallel to a surface of an immobilized substrate, and dependent upon a direction of the exposure angle of the radiation.

20. The system of claim 19, wherein the polarizer comprises a perfectly linear polarizer to perfectly linearly polarize the radiation.

21. The system of claim 19, wherein the polarizer comprises a high exposure angle polarizer to increase the proportion of linearly polarized radiation that is to expose the substrate at a high exposure angle.

22. The system of claim 19, wherein the polarizer includes an opposing pair of polarizing regions at high exposure angles.

23. The system of claim 19, wherein the projection system further comprises a unitary polarizer to increase the proportion of linearly polarized radiation at the pupil plane.

24. The system of claim 19, wherein the polarizer comprises a transmission polarizer.

25. The system of claim 24, wherein the transmission polarizer comprises an annular ring of polarizing features arranged to polarize the radiation in a direction that is substantially parallel to a tangent to the annular ring at each direction of the exposure angle.

26. The system of claim 19, wherein the polarizer comprises a birefringence polarizer.

27. The system of claim 19, further comprising an alternating phase shift mask.

28. A lithography system for forming microelectronic devices, the improvement comprising a pupil plane polarizer to polarize electromagnetic radiation that is to expose a substrate at high exposure angles but not polarize electromagnetic radiation at low exposure angles, wherein the electromagnetic radiation at high exposure angles is polarized in a direction that is dependent upon a direction of the high exposure angles.

29. The system of claim 28, wherein the polarizer is to increase the proportion of linearly polarized electromagnetic radiation in a direction perpendicular to a propagation direction of the radiation and parallel to a surface of a substrate.

* * * * *